United States Patent
Capocelli et al.

(10) Patent No.: US 6,598,190 B1
(45) Date of Patent: Jul. 22, 2003

(54) MEMORY DEVICE GENERATOR FOR GENERATING MEMORY DEVICES WITH REDUNDANCY

(75) Inventors: Piero Capocelli, Milan (IT); Michele Taliercio, Arluno (IT); Rajamohan Varambally, Udupi (IN); Andrea Baroni, Viadana (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/175,220

(22) Filed: Oct. 19, 1998

(30) Foreign Application Priority Data

Oct. 20, 1997 (EP) .............................................. 97830525

(51) Int. Cl.$^7$ ............................. G11C 29/00; G11C 7/00
(52) U.S. Cl. ........................ 714/711; 714/718; 365/200
(58) Field of Search ................................ 714/710, 711, 714/718; 365/200

(56) References Cited

U.S. PATENT DOCUMENTS

| | | | | |
|---|---|---|---|---|
| 5,153,880 A | * | 10/1992 | Owen et al. ................. | 714/710 |
| 5,355,337 A | * | 10/1994 | Kim ............................ | 365/200 |
| 5,652,855 A | | 7/1997 | Ohki .......................... | 395/429 |
| 5,781,717 A | * | 7/1998 | Wu et al. .................... | 714/711 |
| 5,831,913 A | * | 11/1998 | Kirihata ...................... | 365/200 |
| 5,831,914 A | * | 11/1998 | Kirihata ...................... | 365/200 |
| 5,841,709 A | * | 11/1998 | McClure ..................... | 365/200 |
| 6,003,148 A | * | 12/1999 | Yamauchi et al. .......... | 714/711 |
| 6,026,505 A | * | 2/2000 | Hedberg et al. ............ | 714/711 |
| 6,175,936 B1 | * | 1/2001 | Higgins et al. ............. | 714/711 |
| 6,208,570 B1 | * | 3/2001 | Brown et al. ............... | 365/201 |

FOREIGN PATENT DOCUMENTS

| | | | | |
|---|---|---|---|---|
| EP | 0600142 A1 | 6/1994 | ............ | G11C/7/00 |
| EP | 0797145 A1 | 9/1997 | ............ | G06F/11/20 |

OTHER PUBLICATIONS

Jex, J. and Baker, A.; Content addressable memory for flash redundancy; Communications, Computers and Signal Processing, 1991, IEEE Pacific Rim Conference on , 1991 pp.: 741–744 vol. 2.*

Grosspietsch, K.E.; Schemes of dynamic redundancy for fault tolerance in random access memories; IEEE Transactions on Reliability, vol.: 37 Issue: Aug. 3, 1988 pp.: 331–339.*

(List continued on next page.)

*Primary Examiner*—Albert DeCady
*Assistant Examiner*—Joseph D. Torres
(74) *Attorney, Agent, or Firm*—Lisa K. Jorgenson; David V. Carlson; Seed IP Law Group PLLC (57) ABSTRACT

A memory device generator for generating memory devices in a CAD environment, the generator composed of a library file containing predefined basic circuit components; memory array generation algorithm interacting with the library file for generating a variable-size memory array representation having a variable number of memory elements, and at least one redundant memory element; memory element selection circuit generation algorithm interacting with the library file for generating a memory element selection circuit to be associated with the memory array for selecting at least one memory element according to memory device address inputs. The memory element selection circuit generation algorithm having a subroutine for generating a variable-size content-addressable memory representation having a plurality of content-addressable memory locations each one associated to a respective memory element or to a redundant memory element, each of the content-addressable memory locations suitable for storing one of a set of values of the memory device address inputs and for selecting the respective memory element or redundant memory element when the memory device address inputs take the one value.

7 Claims, 5 Drawing Sheets

OTHER PUBLICATIONS

Lombardi, F. and Huang, W.K.; Approaches for the repair of VLSI/WSI RRAMs by row/column deletion; Eighteenth International Symposium on Fault–Tolerant Computing, 1988, FTCS–18, Digest of Papers., 1988 pp.: 342–347.*

Noghani, W.B. and Jalowiecki, I.P.; Design rule centring for row redundant content addressable memories; Defect and Fault Tolerance in VLSI Systems, Proceedings, IEEE International Workshop on, 1992 pp.: 217–226.*

Ciciani, B.; Fault–tolerance considerations for redundant binary–tree–dynamic random–access–memory (RAM) chips; Reliability, IEEE Transactions on, Vol.: 41 Issue: Mar. 1, 1992 pp.: 139–148.*

Park, N. and Lombardi, E.; Repair of memory arrays by cutting; Proceedings International Workshop on Memory Technology, Design and Testing, 1998; On pp.: 124–130 Aug. 24–25, 1998.*

Niggemeyer, D.; Otterstedt, J. and Redeker, M.; A defect–tolerant DRAM employing a hierarchical redundancy scheme, built–in self–test and self–reconfiguration; Proceedings International Workshop on Memory Technology, Design and Testing, 1997; On p.: 3.*

Shyue–Kung Lu; Sy–Yen Kuo and Cheng–Wen Wu; Fault–tolerant interleaved memory systems with two–level redundancy; IEEE Transactions on Computers, vol.: 46 Issue: Sep. 9, 1997 pp.: 1028–1034.*

Nordholz, P.; Otterstedt, J. and Niggemeyer, D.; A defect–tolerant word–oriented static RAM with built–in self–test and self–reconfiguration; Proceedings, Eighth Annual IEEE International Conference on Innovative Systems in Silicon, 1996 Pag.*

Shen, Y.–N.; Park, N. and Lombardi, F.; Spare cutting approaches for repairing memories; Proceedings, IEEE International Conference on Computer Design: VLSI in Computers and Processors, 1996, pp.: 106–111.*

Smith, M.D. and Mazumder, P.; Generation of minimal vertex covers for row/column allocation in self–repairablea arrays; IEEE Transactions on Computers, vol.: 45 Issue: Jan. 1, 1996 pp.: 109–115.*

Stapper, C.H.; Fifield, J.A.; Kalter, H.L. and Klaasen, W.A.; High–reliability fault–tolerant 16–MBit memory chip; IEEE Transactions on Reliability, vol.: 42 Issue: Dec. 4, 1993 pp.: 596–603.*

* cited by examiner

MEMORY DEVICE GENERATOR FOR GENERATING MEMORY DEVICES WITH REDUNDANCY

TECHNICAL FIELD

The present invention relates to the field of memory device generators for the generation of memory devices in a Computer Aided Design (CAD) environment. More particularly, the invention is directed to a memory device generator for generating memory devices with redundancy.

BACKGROUND OF THE INVENTION

It is known that in the field of complex integrated circuits manufacturing CAD tools have been developed to facilitate and speed up the designers' job. Such tools make use of libraries of standard, predefined circuit components and/or building blocks (e.g., logic gates, elementary memory cells, etc.), and generally comprise device generators that interact with the user and the predefined component libraries to generate a resultant complex integrated circuit satisfying the user's needs.

In particular, memory device generators operating in CAD environments have been developed that allow the user to generate a memory device, either stand-alone or to be embedded in a more complex integrated circuit, starting from predefined basic building blocks such as the elementary memory cells. The user can specify the desired size of the memory device to be generated, as well as other parameters. The memory device generator is capable of generating memory devices of variable size.

A single port RAM generator is for example described in EP-A-600142, which is incorporated herein in its entirety by reference.

With respect to a full custom design approach, intended to optimize some aspects such as the silicon area occupation and the circuit speed, this design approach aims at reducing the design time.

Memory devices generated in this way suffer however of the same problems as conventional, fixed-size memories resulting from full-custom design approaches.

One of these problems is the possibility that the resulting memory device contains defective memory elements. In fact, due to the size of the memory cell array and manufacturing process yield problems, it could be desirable to generate a memory device with redundancy capability. This normally involves the provision of additional (i.e., redundant) memory rows and/or columns which, if no defects are present, are left unused, but in case of defects act as an extra memory to be used as a replacement for defective memory rows and/or columns.

During the device testing phase, if a defective memory cell is detected, the entire row or column to which the defective cell belongs is normally replaced by a redundant row or column.

In custom-designed, fixed-size memory devices the implementation of redundancy normally requires the provision of non-volatile memory registers for permanently replacing the defective cells.

Implementation of redundancy in a memory device automatically generated by means of a memory device generator poses problems. In fact, due to the unpredictability of the choices selectable by the user, who can usually specify the number of memory words, the word length (number of bits per word) and sometimes also the memory array aspect ratio (number of rows divided by the number of columns), the insertion by default of some predetermined number of redundant rows and/or columns may result in an inefficiently generated memory.

Additionally, since the memory registers normally used to implement redundancy have to be non-volatile, fuses or Unerasable Programmable ROM (UPROM) memory cells are normally used to form such registers. Integration of standard redundancy techniques in a memory device generator could complicate the manufacturing process of the automatically-generated memory device, because if for example the memory device to be generated is a RAM, integration of fuses or UPROMs memory cells can be achieved only by providing dedicated process steps.

SUMMARY OF THE INVENTION

In view of the state of the art described, it is an object of the present invention to provide a memory device generator to be used in a CAD environment capable of generating automatically memory devices with redundancy, overcoming the problems outlined above.

According to an embodiment of the present invention, such object is achieved by means of a memory device generator for generating memory devices in a CAD environment, the generator comprising:

a library containing predefined basic circuit components;

memory array generation interacting with said library for generating a variable-size memory array comprising a variable number of memory elements, and at least one redundant memory element;

memory element selection circuit generation means interacting with said library means for generating a memory element selection circuit to be associated with the memory array for selecting at least one memory element according to address inputs of the memory device;

wherein said memory element selection circuit generation means comprises means for generating a variable-size content-addressable memory means having a plurality of content-addressable memory locations each one associated with at least one respective memory element or with the at least one redundant memory element, each of said content-addressable memory locations suitable for storing one of a set of values of the memory device address inputs and for selecting the respective memory element or redundant memory element when the memory device address inputs take said one value.

Thanks to the present invention, there is provided a memory device generator suitable for generating memory devices with redundancy capability, overcoming the problems of conventional redundancy techniques. This is made possible by the fact that the memory generator generates memory element selection circuits comprising content-addressable memory means, instead of conventional address decoder circuits. While in fact conventional address decoder circuits have a structure which is fixed once and for all during the design phase, a content-addressable memory can be easily reconfigured. If during testing a memory element is found defective, it can be replaced by a redundant memory element by simply storing in the content-addressable location associated with the redundant element the address configuration initially addressing the defective element.

These and other features and advantages of the present invention will be made more evident by the following detailed description of some embodiments thereof, illustrated as non-limiting examples in the annexed drawings, wherein:

DETAILED DESCRIPTION OF THE INVENTION

Figure 1:
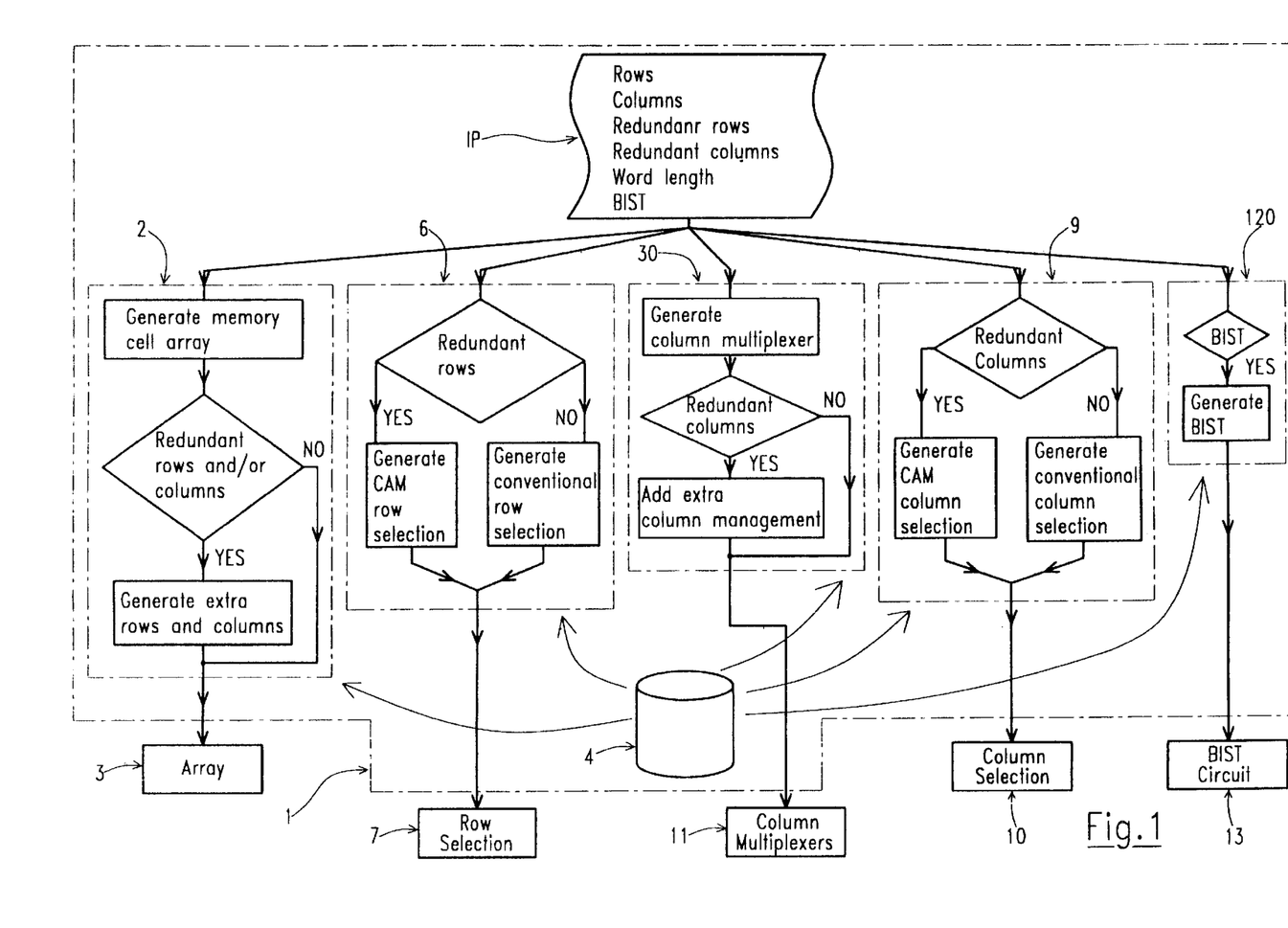
FIG. 1 is a functional block diagram of a memory device generator according to the present invention.

With reference to FIG. 1, a functional block diagram of a memory device generator according to the invention is schematically shown. In this drawing, only those elements of the memory generator which are essential to the understanding of the present invention are shown. Also, the basic functional blocks of the generator will not be described in detail, their structure being well known to the average skilled person.

The memory generator 1 shown in FIG. 1 operates in a conventional Computer Aided Design (CAD) environment, typically running on a workstation, and comprises libraries of standard circuit components or blocks (e.g., SRAM memory core cells, DRAM memory core cells, CMOS logic gates, etc.). The elements of the libraries are used by the generator as basic building blocks for building a complex integrated circuit, in this case a memory device 100 shown in FIG. 2 or 3.

Figure 2:
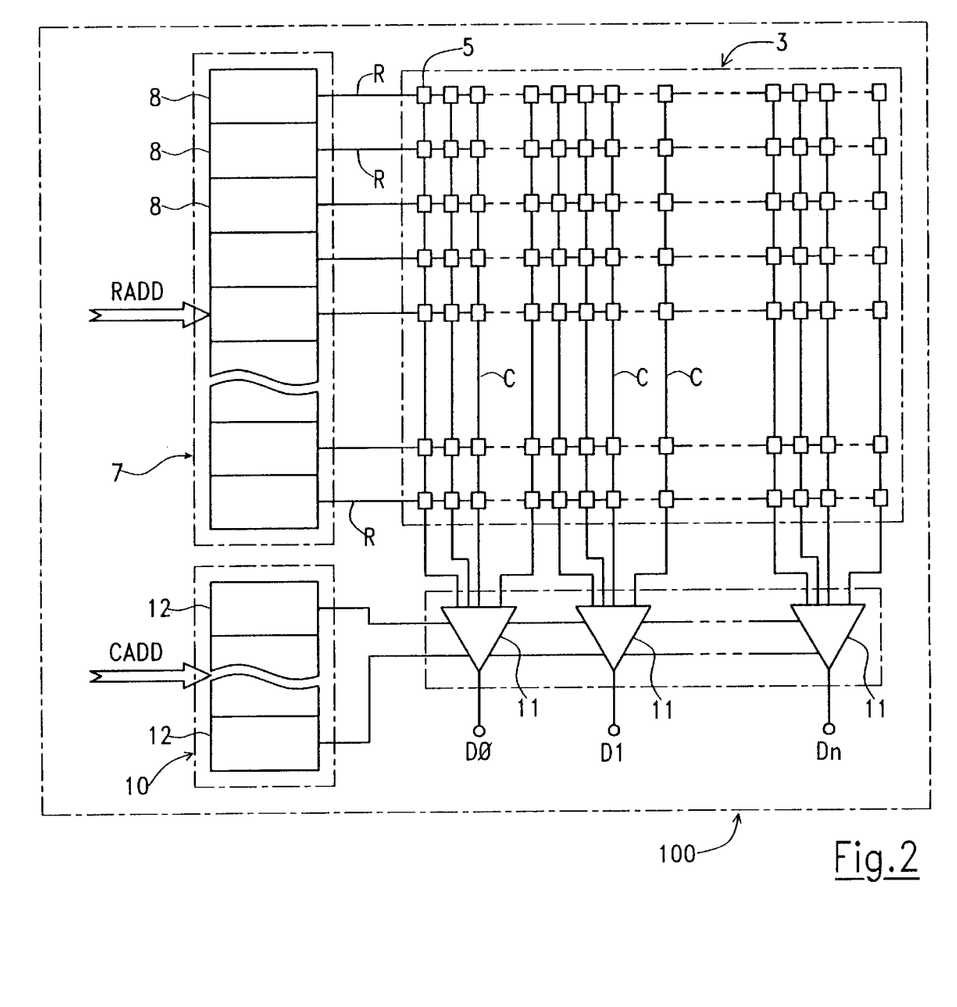
FIG. 2 is a schematic diagram of a first embodiment of a memory device generated by the memory device generator of FIG. 1.

Making now reference to both FIGS. 1 and 2, a memory generator 1 according to one embodiment of the invention comprises a memory cell array generator 2 for generating an array 3 of memory cells. The memory cell array generator interacts with the libraries of components 4 wherein several kinds of standard elementary memory cells are stored. The specific type of elementary memory cell is chosen by the designer of the device (i.e., the designer of the memory device 100 of FIG. 2) according to the type of memory device 100 to be generated; if for example the memory device 100 to be generated is a Static RAM (SRAM), the memory cell array generator 2 will use the standard SRAM elementary memory cell contained in the libraries 4 for building the array of memory cells 3. The user normally supplies the memory generator 1 with input parameters IP by means of which it is possible to define the characteristics of the memory device 100 to be generated. Typically, the user can specify the size of the memory device 100 to be generated; to this purpose, the user can for example specify the so-called "aspect ratio" of the memory cell array 3, supplying the memory generator 1 with the number of rows and the number of columns of the memory cell array 3 in the memory device 100 to be generated, and also the length of the output word of the memory device. Also, according to the present invention, the user can specify that redundant rows and/or redundant columns are to be provided inside the memory cell array. According to the input parameters IP provided by the user, the memory cell array generator 2 generates the memory cell array 3, wherein the memory cells 5 are conventionally arranged in rows R and columns C. The number of rows R and columns C of the memory cell array 3 depends on the user-specified row and column numbers, as well as on the choice to provide the memory cell array with redundant rows and/or redundant columns (extra rows and columns). That is, the generated memory cell array 3 will generally comprise a number of rows R equal to the row number specified by the user, plus a number of redundant rows; similarly, the generated memory cell array 3 will comprise a number of columns C equal to the column number specified by the user, plus a number of redundant columns.

In one embodiment, the number of redundant rows and columns can be automatically set by the memory cell array generator 2 once the user has specified that he desires to implement redundancy in the memory device to be generated; in this case the memory cell array generator 2 determines the optimum number of redundant rows and columns on the basis of the row and column numbers, and the output word length.

In another embodiment, the user can specify that only redundant rows or redundant columns are to be provided, and again the memory cell array generator will automatically determine the optimum number of redundant rows or redundant columns to be provided.

Alternatively, in order to give the user more flexibility in the design of the memory device 100, the user can not only specify that redundant rows and/or redundant columns are to be provided, but he can also specify the exact number of redundant rows and/or redundant columns to be provided in the memory cell array 3.

The memory generator 1 further comprises a row selection circuit generator 6 for generating a row selection circuit 7 to be associated to the memory cell array 3 for selecting a particular row R according to the row address inputs RADD of the memory device 100. Conventionally, both in custom-designed, fixed-size memory devices and in automatically-generated memory devices the row selection circuit comprises a decoder, made up of logic gates, that is supplied with the row address inputs RADD and has a number of outputs equal to the number of rows of the memory cell array. The structure of the decoder is thus fixed, in the sense that the specific row R of the memory array 3 that is selected by a particular logic configuration of the row address inputs RADD is determined once and for all during the design phase. According to the present invention, instead, the row selection circuit generator 6 generates a Content-Addressable Memory (CAM) having a number of content-addressable memory locations 8 equal to the overall number of rows R of the memory array 3 (i.e., the number of rows specified by the user, plus the number of redundant rows). Each content-addressable memory location 8 is associated to a respective row or redundant row R of the memory cell array 3. The row selection circuit generator 6 receives as inputs the user-defined input parameters IP, wherein it is specified the number of rows of the memory cell array 3, and the choice to provide redundant rows (or the desired number of redundant rows to be provided). The row selection circuit generator 6 interacts with the libraries 4, wherein the standard basic building blocks of the CAM are stored. The CAM can be a Static RAM or any other kind of memory device, such as an electrically-programmable non-volatile memory. If no redundancy rows are to be provided, then the row selection circuit generator 6 can generate a conventional row address decoder made up of logic gates (conventional row selection).

The memory generator 1 also comprises a column multiplexer generator 30 for generating column multiplexers 11 to be associated to the memory cell array 3. The column multiplexer generator 30 receives the user-defined input parameters IP specifying the number of columns of the memory cell array 3, the output word length, and the choice to provide redundant columns (or the desired number of redundant columns to be provided), because the number of column multiplexers to be provided depends on the output word length, while the structure of each column multiplexer depends on the output word length and on the overall number of columns C of the memory array 3. Conventionally, each column multiplexer 11 is associated with a respective packet of columns C of the memory array 3. For the sake of simplicity, in the drawing the column multiplexers 11 are assumed to contain also the sensing circuitry for sensing the addressed memory cell. The outputs of the column multiplexers 11 form the output word D0–Dn of the memory device 100.

The memory generator 1 also comprises a column selection circuit generator 9 for generating a column selection circuit 10 to be associated to the memory cell array 3 for driving the column multiplexers 11 so as to select columns C according to the column address inputs CADD. Conventionally, as in the case of the row selection circuit, the column selection circuit comprises a decoder that is supplied with the column address inputs CADD to decode the same for activating one output signal that is used to drive column multiplexers 11. The decoder is made up of logic gates. Thus, the structure of the decoder is fixed, in the sense that the columns to be selected in response to a particular logic configuration of the column address inputs CADD are determined once and for all during the design phase. According to the present invention, instead, if redundant columns are to be provided inside the memory cell array 3, the column selection circuit 10 generated by the column selection circuit generator 9 comprises a content-addressable memory having a number of content-addressable memory locations 12 equal to the number of columns of the memory cell array divided by the output word length, plus the number of redundant columns provided for each packet of columns associated to a respective bit D0–Dn of the output word. The column selection circuit generator 9 receives the user-defined input parameters IP specifying the number of columns of the memory cell array 3, the output word length and the choice to provide redundant columns (or the desired number of redundant columns to be provided), and interacts with the libraries 4 wherein the basic building blocks for generating the CAM 10 are stored. If no redundant columns are to be provided, then the column selection circuit generated by the column selection circuit generator 9 can be a conventional column address decoder made up of logic gates.

Figure 4:
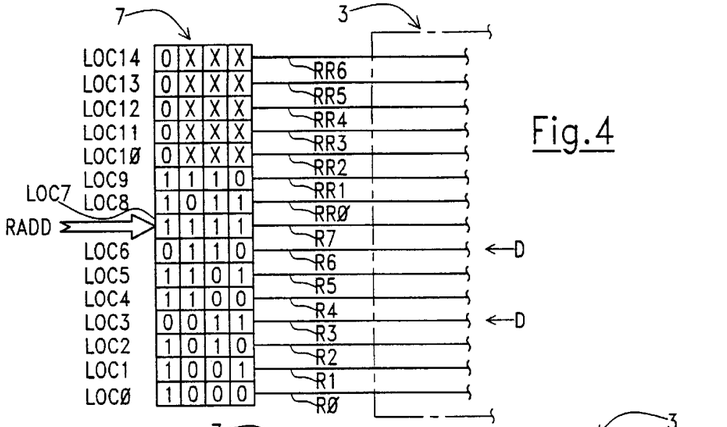
FIG. 4 schematically shows the operation of the memory device of FIG. 2.

Referring to FIG. 4, the operation of the memory device 100 generated by the memory device generator 1 according to the present invention will be now described. For the sake of simplicity, it is assumed that the generated memory device 100 comprises a memory cell array 3 having eight rows R0–R7 and seven redundant rows RR0–RR6. The row selection circuit 7 generated by the row selection circuit generator 6 is a CAM having fifteen content-addressable memory locations LOC0–LOC14, each location associated with a respective row or redundant row of the memory cell array 3. The CAM is supplied with three row address signals RADD suitable for individually addressing one of eight rows of the memory cell array 3. Each content-addressable memory location LOC0–LOC14 comprises four bits: three bits (e.g., the least significant bits) for storing the address of the respective row of the array associated to said CAM location, and one bit (e.g., the most significant bit) used as a flag for indicating that the respective row is defective ("0")/non-defective ("1"). Initially, the first eight locations LOC0–LOC7 of the CAM 7, associated to the rows R0–R7 of the memory array, are loaded with the following content:

LOC0 :1000 (R0)
LOC1 :1001 (R1)
LOC2 :1010 (R2)
LOC3 :1011 (R3)
LOC4 :1100 (R4)
LOC5 :1101 (R5)
LOC6 :1110 (R6)
LOC7 :1111 (R7).

The remaining CAM locations LOC8–LOC14 are all loaded with the content 0XXX, where X means a "don't care" logic state.

Figure 3:
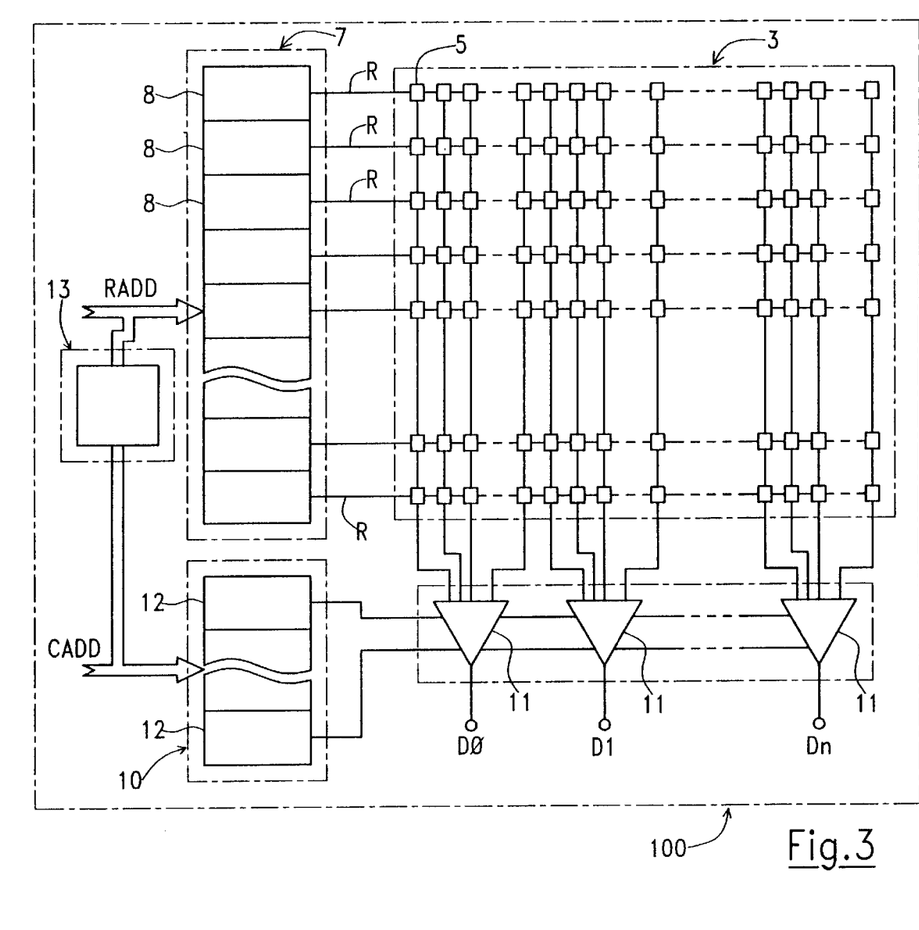
FIG. 3 is a schematic diagram of a second embodiment of a memory device generated by the memory device generator of FIG. 1.

Then, the memory array is addressed for testing. Let's assume that, during testing of the memory device, rows R3 (address 011) and R6 (address 110) are found defective. Then, the most significant bit of the CAM locations LOC3 and LOC6 (associated to the defective rows) is changed to "0", to mean that the respective rows are not to be selected. Two of the seven redundant rows RR0–RR6 can be used to replace the defective rows R3 and R6. Let's assume that redundant row RR0 is used to replace defective row R3, and redundant row RR1 is used to replace defective row R6. Then, CAM locations LOC8 and LOC9 are respectively loaded with the content 1011 and 1110, as shown in FIG. 3. During normal operation of the memory device, when address 011 is supplied to the CAM, the latter identifies that such address is stored in both locations LOC3 and LOC8; however, since the flag bit in location LOC3 is set to "0", defective row R3 is not selected, and redundant row RR0 is selected instead. The same happens when address 110 is supplied: redundant row RR1 is selected in place of defective row R6.

The row selection circuit 7, being a memory, can suffer of the same defectivity problems as the memory cell array 3. Thus, during the testing phase, it is better to test the correct functionality of the CAM first, then test the functionality of the memory cell array 3. During the test of the CAM, if some CAM locations are found defective, they can be replaced by other available CAM locations: for example, if CAM location LOC1 is found defective, it can be replaced by one of the CAM locations LOC8–LOC14 associated to the redundant rows RR0–RR6. This means that in order to determine the number of redundant rows to be provided, not only the degree of defectivity of the memory cell array 3 has to be considered, but also that of the CAM. However, since the CAM has a size much smaller than that of the memory cell array 3, the overhead will be limited.

The above example is limited for simplicity to the case of the rows, but identical reasoning can be made for the columns of the memory array.

An advantage of the memory generator of the invention is that it allows for generating memory devices with redundancy able not only to overcome defects detected during the testing phase, but also occurring during the entire life of the integrated device in which the memory device is integrated. In fact, being the row selection circuit a CAM, it can be reconfigured at any time, for example at the device power-on, so that initially unused redundancy rows can be subsequently used to replace other defective rows.

Referring now to FIGS. 1 and 3 another embodiment of the memory generator will be described. In this embodiment, the memory device generator 1 additionally comprises a Built-In Self Test (BIST) generator 120 for generating a BIST circuit block 13 to be associated to the memory device 100 to be generated. The detailed structure of the BIST generator 120 and that of the BIST block 13 are not described in detail, being well-known to the skilled technician. BIST techniques are more and more employed in the field of complex integrated circuits for reducing the testing time. The BIST block 13 associated to the memory device 100 allows for automatically performing, inside the integrated circuit, testing of the memory device. The BIST block preferably performs a testing of the CAMs 7 and 10, then it performs a testing of the memory cell array 3.

Figure 5A:
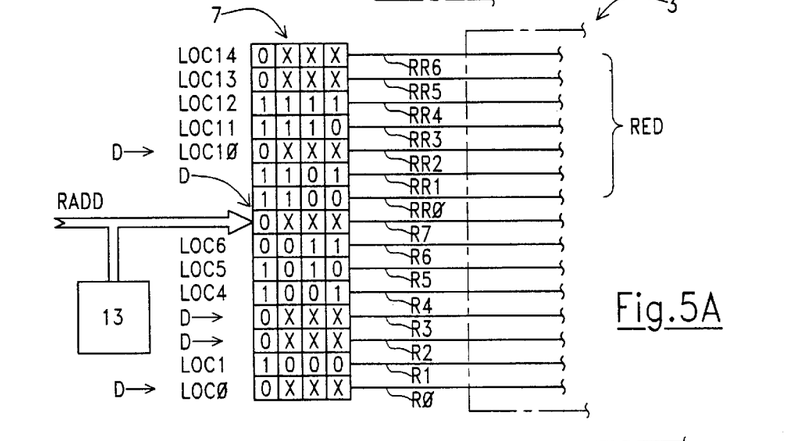
FIGS. 5A and 5B schematically show the operation of the memory device of FIG. 3.
Figure 5B:
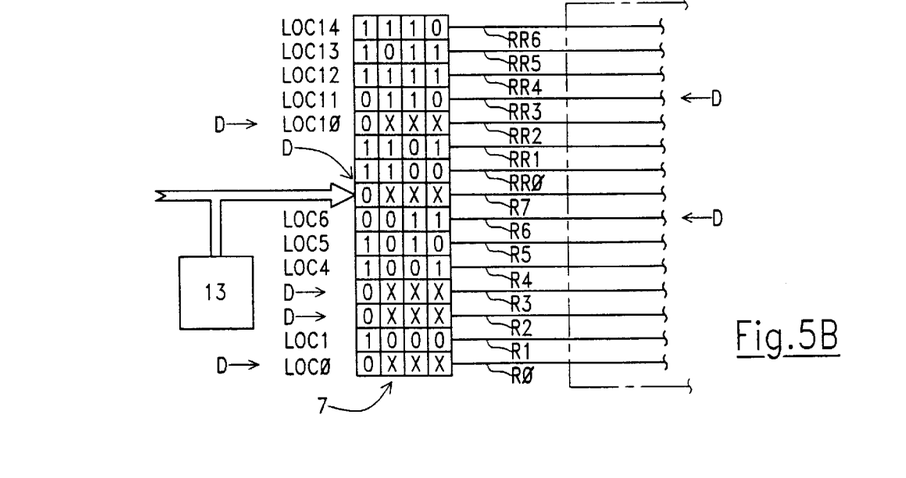

Referring to FIGS. 5A and SB, the same example of FIG. 4 is taken to explain the operation of the memory device 100 generated by the memory generator 1, now considering also the BIST generator block 120. Initially (FIG. 5A) the BIST block 13 tests the CAM 7 to verify the existence of defective CAM locations. Let's assume that CAM locations LOC0, LOC2, LOC3, LOC7 and LOC10 are found defective. Then, these locations are loaded with the content "0XXX", to mean that they are defective and are not to be used. The remaining locations of the CAM are loaded with the following content:

LOC1 :1000 (R1)
LOC4 :1001 (R4)
LOC5 :1010 (R5)
LOC6 :1011 (R6)
LOC8 :100 (RR0)
LOC9 :1101 (RR1)
LOC11:1110 (RR3)
LOC12:1111 (RR4)
LOC13:0XXX (RR5)
LOC14:0XXX (RR6).

Thus, rows R0, R2, R3, R7 and redundant row RR2 of the memory array 3 will not be used, even if they are not defective, because the associated CAM location has been found defective.

Then, the BIST block 13 tests the eight rows R4, R5, R6, RR0, RR1, RR3, RR4 of the array to verify if they are defective or non-defective. Let's suppose that row R6 and redundant row RR3 are found defective; then, the flag bit in each of the corresponding CAM locations LOC6 and LOC1 is set to "0", and the two still unused redundant rows RR5, RR6 are used to replace such defective rows; to this purpose, the CAM locations LOC13 and LOC14 are respectively loaded with the contents "1011" and "1110".

Same reasoning can be straightforwardly applied to the CAM 10 for the columns of the memory array.

Figure 6:
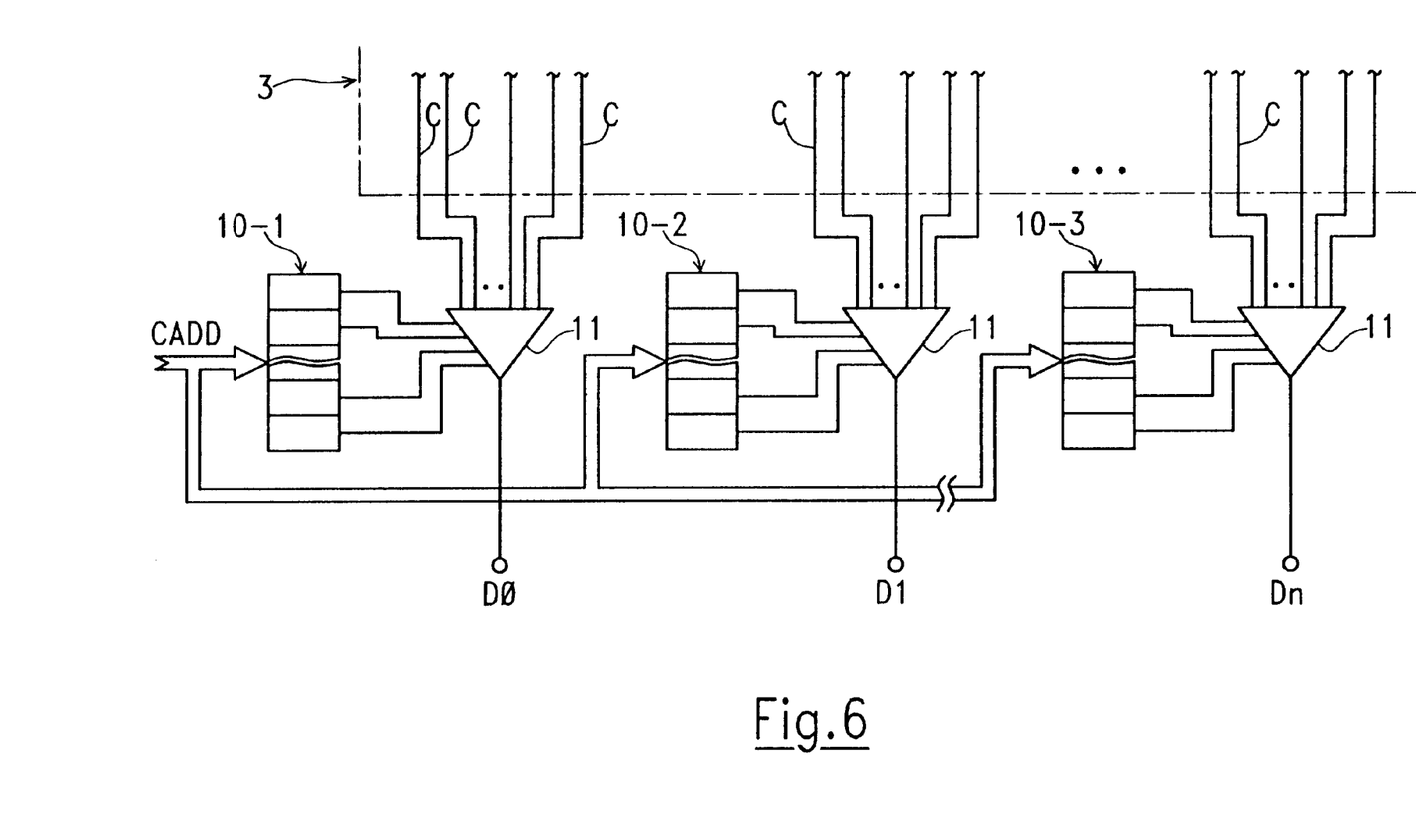
FIG. 6 schematically shows a third embodiment of a memory device generated by the memory device generator of FIG. 1.

FIG. 6 shows a different embodiment of a memory device that can be generated through the memory device generator schematically shown in FIG. 1. In this embodiment the column selection circuit generator 9, instead of generating a single CAM 10 for driving all the column multiplexers 11, generates as many CAMs 10-1 to 10-n as the number of column multiplexers 11. This allows for a better usage of the redundant columns provided in the memory array. In fact, while in the former embodiments if a defective column of a given column packet is replaced by a redundant column of the same packet the same replacement takes place also for identical-address columns of other packets, in this embodiment a defective column of a given column packet can be replaced by a redundant column of such packet without causing a same substitution to occur in the remaining packets.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device compiler arranged in a computer aided design environment having a central processing unit, a keyboard, a monitor, a mass storage device wherein the central processing unit is in communication with the keyboard, the monitor and the mass storage device comprising:

a plurality of standard memory cells arranged in a library stored on the mass storage device, accessible by the central processing unit, and viewable on the monitor;

a memory compiler algorithm stored on the mass storage device, accessible by the central processing unit and responsive to input commands from a user via the keyboard to define a physical configuration of a memory representation such that the memory representation is composed of a content-addressable-memory cell and memory array formed of a subset of cells of the plurality of standard memory cells of the library; and a built in self test structure capable of addressing and testing both the memory array and the content-addressable memory cell.

2. The memory compiler according to claim 1 wherein the subset of cells comprises a memory device having a redundant column and row, and a plurality of logic storage cells arranged in an array, and the array being accessed by a row selection means and a column selection means.

3. The memory compiler according to claim 2 wherein the redundant column is selected by the content-addressable-memory cell.

4. The memory compiler according to claim 3 wherein the physical configuration is a result file resident on the mass storage device being written to the mass storage device by the memory compiler algorithm.

5. The memory compiler according to claim 1 wherein the physical configuration defines a memory having a plurality of address ports, a plurality of control ports and a plurality of data ports.

6. The memory compiler according to claim 1 wherein the content-addressable-memory cell is one of the standard memory cells of the library.

7. The memory compiler according to claim 1 wherein the content-addressable-memory cell comprises a column selection device of the memory representation.

* * * * *